United States Patent [19]

Pan

[11] Patent Number: 5,491,428
[45] Date of Patent: Feb. 13, 1996

[54] BUS-ISOLATING PRE-CHARGE BUFFER

[75] Inventor: Michael Pan, Cupertino, Calif.

[73] Assignee: Hitachi Microsystems, Inc., Santa Clara, Calif.

[21] Appl. No.: 170,052

[22] Filed: Dec. 20, 1993

[51] Int. Cl.$^6$ ............................................. H03K 19/017
[52] U.S. Cl. ............................ 326/17; 327/374; 327/382; 365/203
[58] Field of Search ................................. 326/86, 87, 17; 327/108, 109, 111, 112, 374, 382; 365/203

[56] References Cited

U.S. PATENT DOCUMENTS

| | | | |
|---|---|---|---|
| 4,038,567 | 7/1977 | Lewis et al. | 307/362 |
| 4,507,574 | 3/1985 | Seki et al. | 307/448 |
| 4,542,306 | 9/1985 | Ikeda | 307/443 |
| 4,897,567 | 1/1990 | Bacrania | 307/475 |
| 4,982,115 | 1/1991 | Lee | 307/475 |
| 5,068,551 | 11/1991 | Bosnyak | 307/475 |
| 5,075,578 | 12/1991 | Wendell | 307/475 |
| 5,168,178 | 12/1992 | Allen et al. | 307/45 |
| 5,325,335 | 6/1994 | Aug et al. | 365/203 |
| 5,408,437 | 4/1995 | Cho et al. | 365/203 |
| 5,418,748 | 5/1995 | Monden | 365/203 |

*Primary Examiner*—Timothy P. Callahan
*Assistant Examiner*—My-Trang Nu Ton

*Attorney, Agent, or Firm*—Flehr, Hohbach, Test, Albritton & Herbert

[57] ABSTRACT

A bus line is divided into at least first and second bus segments that are coupled together via a precharge buffer, each segment seeing less effective RC than if segmentation were not present. The precharge buffer provides first and second output buffer lines (or segments) that are monitored and cross-coupled through the buffer such that each line is pulled-up or pulled-down substantially simultaneously to keep equivalent states in each. Feedback provided by the cross-coupling further hastens the process of bus pull down. Still further acceleration of the pulldown process can result by sensing bus pulldown at trip point that is higher than a conventional logic level trip point. Segmenting the bus and coupling the segments with a precharge buffer results in less equivalent RC being presented to each bus segment. Thus, effective shunt capacitance is reduced, allowing use of downsized transistors coupled to the output buffer lines to pull down the bus segments. This saves integrated circuit chip area, reduces pulldown surge current and ground bounce. Further, the decreased load capacitance achieved by using smaller pulldown load devices reduces capacitive bus loading, and thus contributes to a more rapid change of bus state. Alternatively, for a given pulldown current, the present invention permits a segmented bus to be pulled down more rapidly than a conventional non-segmented bus configuration.

16 Claims, 4 Drawing Sheets

BUS-ISOLATING PRE-CHARGE BUFFER

FIELD OF THE INVENTION

This invention relates to digital integrated circuits, and more particularly to such circuits employing busses and buffers that pre-charge such busses.

BACKGROUND OF THE INVENTION

Digital circuits frequently use a bus line (or simply, "bus") to couple a logical high ("1") or logical low ("0") signal to various circuits or loads. Some examples include a data bus, an address bus, and the like in a central processing unit ("CPU"), or a refresh signal for use with a volatile digital memory.

In many applications, a precharge transistor is coupled between the bus and a known voltage level, typically the upper power supply voltage Vdd. The bus and precharge transistor are typically fabricated on a common integrated circuit chip. Many pulldown load transistors are also coupled to the bus. During precharge mode, the precharge transistor turns on, pulling the bus up to the Vdd level, or at least to a level representing a logical "1" e.g., ≧2.3 VDC in a 3 VDC system. After precharge mode, any one of the pulldown load transistors can turn on, to pull the bus down to a "0" level, e.g., ≦1.3 VDC in a 3 VDC system. In the prior art, bus shunt capacitance is large and therefore large, high current, pulldown load transistors are required if the bus is to be pulled rapidly down to "0".

A bus line may be represented by many sections of series-coupled resistance ("R") and shunt-coupled capacitance ("C"), which sections are distributed along the length of the bus. Often busses are relatively long and heavily loaded, being coupled to many output loads that contribute substantial effective load capacitance that stores charge. A problem, toward which this application is directed, is how to rapidly discharge or pull down a bus line from a precharged "1" level to a "0" level, especially when substantial capacitance must be discharged.

FIG. 1A depicts a prior art bus system as containing a bus, a bus pull-up precharge transistor M1, and several output load pulldown transistors M101, M102, M103, M104. Precharge transistor M1 receives a precharge signal nprc, which is "0" for precharge in the configuration shown. When nprc=0 at time tp, transistor M1 turns on and pulls-up the bus to Vdd, pre-charging it to at least a logical "1" voltage level.

Precharge mode, e.g., the time during which nprc turns-on M1, is a fraction of the total clock cycle time associated with the circuit, for example 25%, which may correspond to a precharge pulse width of about 5 ns to 10 ns. During precharge, the bus sees a low drive impedance, namely the output impedance of voltage source Vdd in series with the source-drain impedance of M1.

Precharge ends when nprc goes high, whereupon the precharged bus essentially floats in a "1" state and sees a relatively large impedance. For ease of understanding, the simplified bus waveform in FIG. 1A shows a decay after precharge mode ends (and before bus pulldown occurs at time t4). In practice, however, the bus can remain at a "1" level due to capacitance shunting the bus and due to keeper-type circuitry, not herein relevant. The "1" level bus condition can exist until such time as a pulldown transistor is turned on by its input signal, and pulls the bus to a "0" state, for example at time t4. Prior art bus pulldown characteristics will be described more fully with respect to FIG. 1C.

Although only four pulldown load transistors (M101–M104) are shown in FIG. 1A, it is understood that tens of thousands of such pulldown load transistors may be present. These transistors function together as a wired OR gate in that any one of them can pull the bus down to a logical "0" state. For example, in FIG. 1A, at time $t_4$ the bus is pulled low by one of the pulldown load transistors, e.g., M104, whose gate has received a "1" input signal, e.g., IN4.

FIG. 1B represents an equivalent circuit for the prior art configuration of FIG. 1A, and depicts the distributed RC bus loading referred to earlier. For ease of illustration, only one of potentially many pulldown transistors is depicted, namely M104. In FIG. 1B, X1, X2 and X3 refer to various nodes present within the distributed RC equivalent bus circuit, with X3 denoting the extreme bus end most remote from M104. While FIG. 1B approximates the bus as having four distributed RC sections, in reality there are N distributed RC sections, where N approaches infinity.

In the four-section analysis of FIG. 1B, the pulldown time constant seen by pulldown load transistor M104 is 4·(R/4)·4·(C/4)=1RC. Using a typical value for R of 2 KΩ, and a typical value for C of 7.2 pF, the RC time constant is about 14.4 ns. When M104 turns on, there will be a signal propagation delay before node X3 capacitance can discharge from a logical "1" down to a logical "0". This signal propagation delay will be the delay resulting from the turn-on or transistor M104, plus the time constant delay across the bus, here 1RC. It will be appreciated that as the bus length increases, effective load capacitance also increases and additional delay or skew accumulates.

In the simplified bus shown in FIG. 1B, at time t4, pulldown load transistor M104 is turned on by input signal IN4, and begins to pull nodes X3, X2, bus and X1 down toward a "0" level. If the bus had no distributed RC, the nodes and bus level could be pulled toward "0" relatively rapidly without the load pulldown transistor having to sink substantial discharge current. Unfortunately, such is not the case and in practice the pulldown load transistors must be large devices that can sink substantial drain-source current.

FIG. 1C is a SPICE analysis of the pulldown response of nodes X1, bus, X2 and X3 for the prior art circuit of FIGS. 1A and 1B. This computer simulation assumes a relatively large sized metal-on-silicon load pulldown transistor having a field effect gate width/length ratio ("W/L") of about 80, and an effective capacitive load of about 7.2 pF. It is understood in FIG. 1C that precharge mode has come and gone, and that the bus and nodes X1, X2 and X3 have been pulled up to "1", e.g., ≧2.3 VDC. After precharge ends and before any pulldown load transistor turns on, the bus sees a relatively large impedance in that M1 and M104 (as well as any other pulldown load transistor) are floating rather than conducting.

In FIG. 1C, at approximately time=−1 ns, a gate input signal ("IN") to a pulldown load transistor goes high (here, IN4="1"), which turns on the corresponding pulldown load transistor (here, M104). If there were no distributed RC, node X1, bus, node X2 and node X3 could instantly be pulled low. However, as shown by FIG. 1C, due to the effect of the distributed RC, node X1 is first pulled low, then the bus node, then node X2, and finally the most remote node, node X3.

FIG. 1C indicates that it takes $T_d$~8 ns for the voltage at node X3 to be pulled from a "1" state (e.g., ≧2.3 VDC) to a "0" state (e.g., ≦1.3 VDC), relative to when IN~1.3 VDC.

It is understood that as the bus length is increased or as more capacitive loads are coupled to the bus, pulldown time $T_d$ is extended and rapid bus pulldown becomes more difficult to attain. To substantially shorten $T_d$ requires that the pulldown load transistors be capable of sinking substantial drain-source current. This in turn requires the pulldown load transistors to be relatively large devices having a W/L ratio of about 50 or more.

Thus, one disadvantage of the prior art configuration of FIGS. 1A–1B is that the various pulldown load transistors M101, M102, etc., must be large devices capable of sinking substantial current $i_{pulldown}$, if rapid bus pulldown is to be achieved. This statement is true because $i_{pulldown} \sim C_{equivalent} \Delta V/\Delta T$, where $\Delta V/\Delta T$ represents the pulldown transition rate, and C represents the total equivalent load capacitance shunting the bus.

However, requiring the pulldown load transistors to sink large pull-down current is undesirable because current surges and ground bounce transients can occur, to the detriment of other signals in the system. Further, having to fabricate many large sized pulldown load transistors leaves less integrated circuit chip area for fabricating other portions of the circuitry. Also, as the pulldown load transistors increase in size, they contribute still more load capacitance to the bus, compounding the problem of rapid bus pulldown.

In summary, what is needed is a method and apparatus whereby the effective distributed resistance and capacitance associated with a bus can be reduced. The resultant bus could then be pulled-down using less pulldown current, ipulldown, thereby permitting the use of smaller W/L pulldown load devices that would reduce current surge and ground bounce. Further, the use of smaller pulldown load devices saves integrated circuit chip area, and presents less capacitive loading to the bus.

The present invention provides such a method and apparatus.

SUMMARY OF THE PRESENT INVENTION

The present invention divides a bus line into at least first and second bus segments that are electrically isolated from each other but are coupled together via a precharge buffer. Each bus segment sees substantially less effective RC than if the bus were left intact, the equivalent RC time constant represented-by two equal length segments being only 25% of the time constant represented by a prior art, unsegmented, bus. However, the segments need not be equal in length, and more than two segments may be used.

The precharge buffer has an input port coupled to receive a precharge signal, and also has first and second output ports, coupled respectively to the first and second bus segments. Load pulldown transistors, not part of the precharge buffer, are coupled between the first or second bus segments and ground.

The precharge buffer includes first and second precharge transistors coupled, respectively, between the first and second bus segments and the upper power supply, Vdd. In response to the precharge signal, these transistors pull each bus segment up to Vdd during precharge mode. The precharge buffer further includes first and second buffer pulldown transistors cross-coupled, respectively, between the second and first bus segments and a lower power supply, preferably ground.

The precharge buffer also includes first and second NOR gates whose inputs are coupled to the precharge signal and to one of the bus segments, and whose NOR output is coupled to one of the buffer pulldown transistors. The NOR gates cause the buffer pulldown transistors to be off during precharge, thus preventing excess DC current flow. Further, the NOR gates ensure equivalent logic states for each bus segment by sensing when one bus segment is being pulled down by an external pulldown load transistor, and causing the buffer pulldown transistor coupled to the other bus segment to turn on. Feedback provided by the cross-coupling hastens pull down of each bus segment.

In a second aspect, the precharge buffer still further accelerates the pulldown process by early sensing when a bus segment is pulled down by an external pulldown load transistor. Early sensing results from providing the cross-coupled NOR gates with a trip point that is higher for sensing a bus segment level than for sensing the precharge signal level.

In either aspect, since less equivalent RC is presented to each bus segment, effective C is reduced, allowing pulldown load transistors coupled to the buffer segments to be down-sized. The ability to use smaller W/L load pulldown transistors saves integrated circuit chip area, reduces pulldown surge current and ground bounce. Further, the decreased load capacitance achieved by using smaller load pulldown devices reduces capacitive bus loading, and thus contributes to a more rapid change of bus state. Alternatively, for a given magnitude of pulldown current, the present invention permits a segmented bus to be pulled down more rapidly than a prior art bus configuration.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 2:
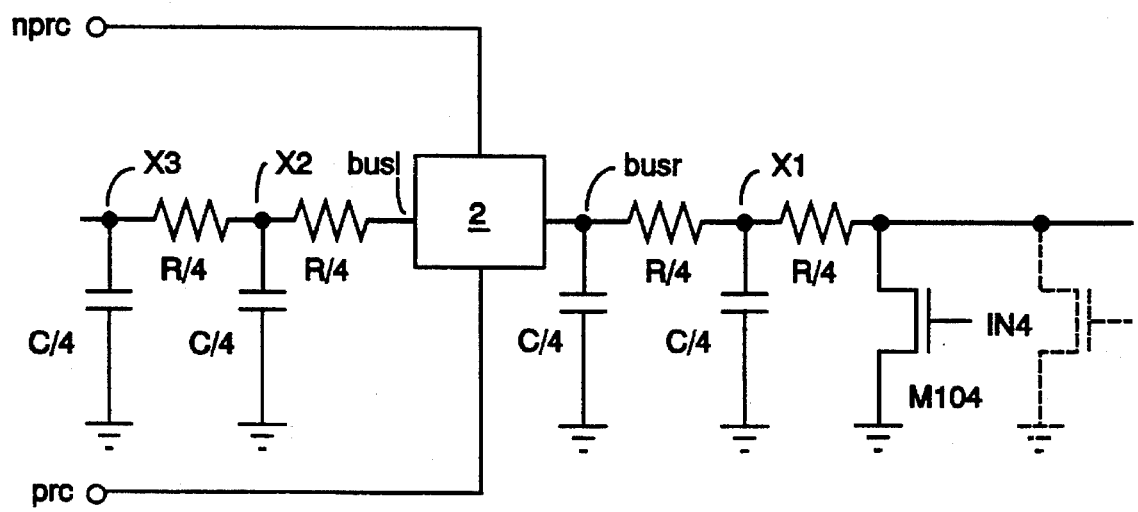
FIG. 2 depicts a bus configuration and the effective distributed RC, according to the present invention.

FIG. 2 depicts a first embodiment of the present invention, an isolating pre-charge buffer 2 that is coupled between a bus line that has been segmented. In FIG. 2, the bus has been divided into two segments, busl and busr, each of which is coupled to an output port of precharge buffer 2. Pre-charge buffer 2 has two input ports that preferably receive complementary pre-charge signals, prc and nprc. The various resistors R and capacitors C in FIG. 2 denote the equivalent distributed resistance and capacitance of the segmented bus lines busl, busr. Various nodes in the bus are denoted X1, X2, and X3. M104 denotes a pulldown load transistor that operates in response to a pulldown signal IN4 and, as indicated by the second pulldown load transistor drawn in phantom, it is understood that many such pulldown load transistors are in fact present.

According to the present invention, the bus may be divided into N segments that need not be of equal length, where N>2, and where (N−1) buffers are used, according to the present invention. However, the preferred embodiment will be described with respect to a single buffer 2 located between a bus that is divided into N=2 segments, which segments may be, but need not be, equal in length.

Figure 1A:
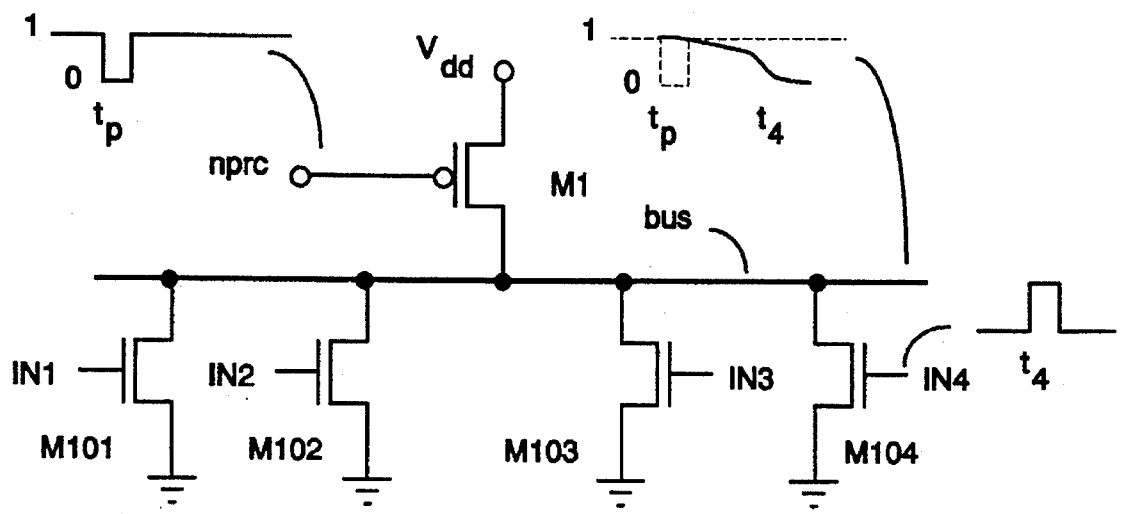
FIG. 1A depicts a conventional bus configuration, according to the prior art.
Figure 1B:
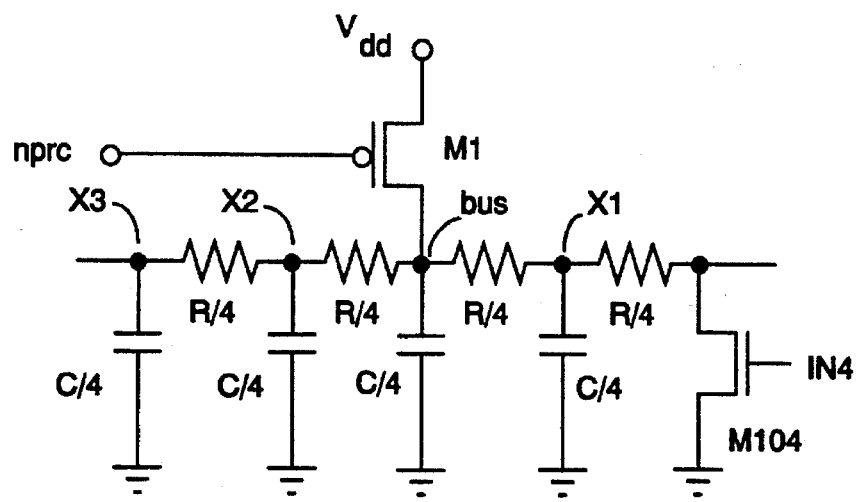
FIG. 1B depicts the distributed RC associated with the bus configuration of FIG. 1A, according to the prior art.

It will be appreciated that if the output ports of precharge buffer 2 were short-circuited together, busl and busr would be coupled in series, whereupon the configuration of FIG. 2 would resemble the prior art configuration of FIG. 1B.

Consider, however, the advantages realized by the configuration shown in FIG. 2, wherein the bus has been segmented into busl and busr, which are isolated from one another by pre-charge buffer 2.

Thanks to the presence of buffer 2, the pulldown time constant seen by M104 looking into the right buffer output port (busr) is 2·(R/4)·2·(C/4)=(RC)/4. Similarly, looking from the left output buffer port, the pulldown time constant is similarly (RC)/4. Note that these time constants are 75% less than the pulldown time constant seen by M104 in the prior art configuration of FIG. 1B. Thus, segmenting a bus into, in the example of FIG. 2, two segments (busl, busr) separated by a buffer 2, reduces the effective time constant associated with a prior art bus by 75%.

In FIG. 2, the signal propagation delay for a pulldown load transistor coupled in shunt with node X3 will be the delay seen by transistor M104 plus RC/4 plus the delay associated with pre-charge buffer 2 plus RC/4, which is:

propagation delay=M104 delay+RC/2+buffer 2 delay

As will be demonstrated, this signal propagation delay is also substantially faster than the propagation delay associated with the prior art configuration of FIGS. 1A–1B. Understandably, unless the buffer 2 delay is less than a distributed RC section delay, there would be little motivation to use the present invention. Thus, while the present invention can function advantageously for N>2 segments, in practice, the advantage realized by the present invention is approximately geometrically related to N. Further, for relatively large N, having to provide (N−1) buffers can require considerable area on the integrated circuit chip containing the bus and the present invention.

In addition to providing an isolating function between bus segments busl, busr, where each isolated bus segment sees less equivalent load capacitance, buffer 2 must also include circuitry ensuring electrical equivalence for each bus segment, such that busl=busr. Such circuitry will now be described with respect to FIG. 3.

Figure 3:
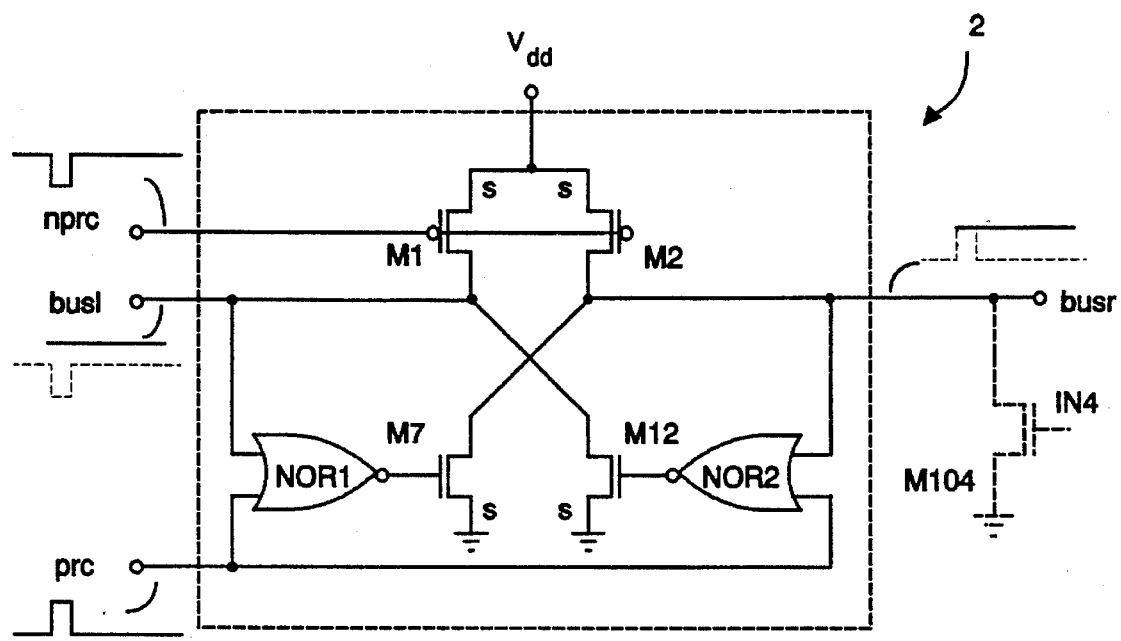
FIG. 3 is a simplified schematic of a preferred embodiment of the present invention.

FIG. 3 is a simplified schematic of the isolation buffer 2, and shows two bus segments busl and busr coupled to the two output ports, and shows two complementary precharge input signals, nprc and prc, coupled to two input ports.

During precharge, nprc=0, and transistors M1 and M2 turn on, pulling busl and busr respectively toward Vdd. Pullup can occur rapidly because the bus segments see a relatively low impedance, namely the source-drain impedance of M1 or M2 and the Vdd power supply output impedance. With respect to FIG. 2, node X1, busr, busl, node X2 and node X3 will all be precharged to a "1" state. It is understood that it is sufficient if these nodes and busr and busl are pulled up to a magnitude that is at least a logical "1" level, for example, a magnitude≧2.3 VDC in the preferred embodiment, where Vdd=3.0 VDC.

Buffer 2 includes two NOR gates, NOR1 and NOR2, which ensure that no large DC current path exists, and further function as "keepers" that monitor the state of each bus segment and ensure that each bus segment is in the same state. For example, if busr is pulled down (e.g., by M104), the keeper circuitry will detect this condition and cause busl to also be pulled down. Similarly, if busl is pulled down (e.g., by M101), the keeper circuitry will detect this condition and cause busr to also be pulled down.

When nprc=0 (e.g., during precharge), prc=1, and the outputs from NOR1 and NOR2 will be "0", which output state ensures that buffer pulldown transistors M7 and M12 are off, permitting busr and busl to be pulled high. Because M7 and M12 are now off, this configuration prevents a low impedance DC current path between Vdd and ground through M1 and M12, and/or through M2 and M7. While any resultant excessive DC current flow might not necessarily harm M1 or M12, or M2 or M7, precharging would be slowed.

After the precharge time interval has ended, nprc returns from a "0" state to a "1" state, whereupon pull-up transistors M1 and M2 turn off. The bus segments now float, and see a relatively large impedance in parallel with the impedance contribution of the pulldown load transistors coupled to the bus segments.

Assume that some time after precharge mode has ended IN4 turns on M104. M104 will then exhibit a low rather than a high output impedance, and will discharge or pull busr down from a "1" state toward a "0" state. As the voltage at busr falls below the "0" threshold, typically about 1.3 VDC for the preferred embodiment, both inputs to NOR2 are "0".

With both input signals to NOR2 low, the gate signal to M12 will be "1" and transistor M12 turns on M12 is cross-coupled to busl, which segment it rapidly pulls down toward a "0" state. Thus, the NOR1, M2 and NOR2, M1 circuitry senses whichever segment is pulled down (busr in the above example), and pulls down the remaining segment, whereupon busl=bust="0".

Once busl="0", NOR1 sees two low input signals, and provides a "1" output signal that turns on transistor M7, which reinforces the pulldown of busr toward "0". It is understood that busl will also be coupled to pulldown load transistors (e.g., M101), any of which can pull busl down toward "0", whereupon the circuitry of FIG. 3 will force busr=0=busl.

Figure 4:
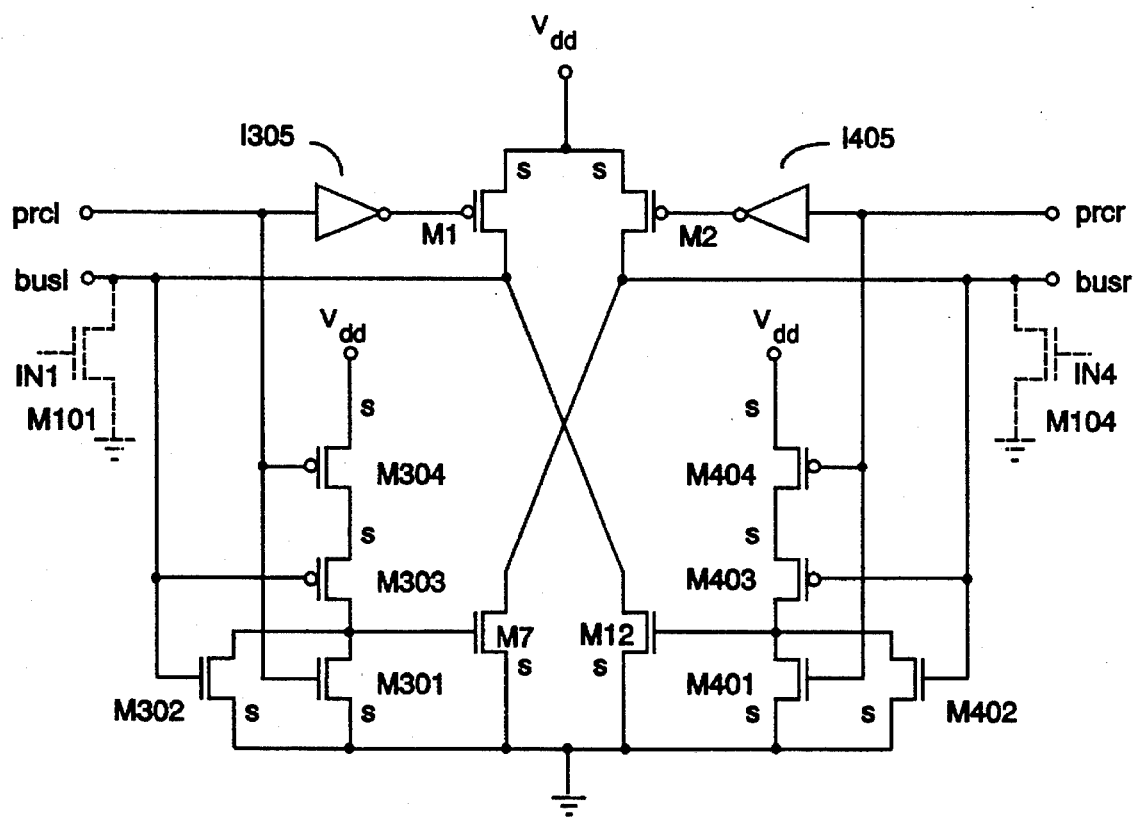
FIG. 4 is a detailed schematic showing implementation of the embodiment of FIG. 3, according to the present invention.

FIG. 4 is a schematic of a preferred embodiment of a buffer 2, according to the present invention. In this embodiment, there are two input ports that receive precharge signals prcl and prcr, and two output ports coupled to the two bus segments, busl and busr. It will be appreciated from FIG. 4 that transistors M301, M302, M303 and M304 implement logic gate NOR1 in FIG. 3, while transistors M401, M402, M403 and M404 implement logic gate NOR2 in FIG. 3.

In a 64 bit system, there will be 64 bus lines, e.g., the configuration of FIG. 4 will be repeated 64 times to provide 64 busl and 64 busr segments. If a single precharge driver circuit had to drive all 64 buffers 2, 128 loads would be presented. To reduce the load requirement upon such driver circuit, the preferred embodiment of FIG. 4 uses two in-phase prcl and prcr precharge signals. Of course, if a suitable driver circuit is available, a single prc signal may be coupled to both input ports. However in the preferred embodiment, two separate in-phase precharge signals are provided to minimize loading on the driver circuitry providing the precharge signals.

In FIG. 4, precharge mode occurs when prcr=prcl= "1" since M1 and M2 are turned on by the inversion of these signals produced by inverters I305 and I405. When M1 and M2 are on, busl and busr are pulled up towards Vdd. During precharge, the prcr=prcl="1" level coupled to a logic gate NOR input provided by transistors M301 and M401 turns M301 and M401 on.

When M301 and M401 are on, due to precharge, the gate voltage input to transistors M7 and M12 is "0" which ensures that transistors M7 and M12 are off. Thus, this configuration prevents excessive DC current flow from Vdd through M1 and M12, and/or through M2 and M7, similar to what has been described with respect to FIG. 3. Further, as long as busl is "1" transistor M302 is on, which further ensures transistor M7 is off. Similarly, as long as busr="1" transistor M402 will be on, which further ensures that transistor M12 is off.

Transistors M304 and M404 are off during precharge, since their respective gate signals are "1". After precharge mode, prcr=prcl=0, whereupon transistors M1 and M2 turn off, and transistors M304 and M404 turn on.

After precharge mode has ended, busr and busl can remain "1" because M7 and M12 will remain off as long as busl and busr, respectively, are "1". Of course, when a pulldown load transistor (e.g., M101 or M104) turns on, the bus segment to which that transistor is coupled will be pulled down. The cross-coupled circuitry in FIG. 4 will sense or monitor pull down of that segment and will cause the other segment(s) to be pulled down as well, thus keeping the same signal on both segments.

Assume that some time after precharge mode has ended, IN4 goes high, turning on pulldown load transistor M104, and thus pulling down busr. Conventional logic circuitry typically responds to a falling signal such as busr by sensing when a trip point corresponding to a logical "0" has been passed, for example when busr 1.3 VDC for a Vdd=3 VDC logic system. However, the circuit of FIG. 4 advantageously rapidly senses a "1" to "0" transition on either bus segment by providing NOR gate transistors M302 and M402 with a Vth threshold voltage trip point higher than the conventional 1.3 VDC "0" logic trip point. As described below, this permits cross-coupled transistors M7 and M12 to respond faster when a bus segment is pulled down, to pull the other bus segment down sooner.

This differential trip point is realized by fabricating transistors M302 and M402 as smaller devices than transistors M301 and M401, e.g., by fabricating a smaller conduction channel width to length ratio ("W/L"). This downsizing causes M302 and M402 to have a higher threshold voltage $V_{th}$, preferably a voltage just below a conventional a logical "1", e g., ~2.3 VDC for a Vdd=3 VDC circuit. By contrast, transistors M301, M401 are fabricated with a larger W/L, and have a $V_{th}$ approximating the conventional logic "0" level, ~1.3 VDC for a Vdd=3 VDC circuit.

The advantage provided by downsizing M302 and M402 is seen by considering what occurs in turning on buffer pulldown transistor M12 after precharge, as transistor M104 pulls busr down. Clearly transistor M401 is off at all times after precharge mode has ended, since prcr= "0". However, M12 cannot turn on (and thus pull busl down) until transistor M402 is turned off by busr, which is transitioning from "1" to "0" state. Stated differently, as soon as M402 turns off, M12 can turn on to pulldown busl. It is therefore advantageous that M402 turn off as soon as possible during a "1" to "0" busr transition, e.g., that its Vth be higher than a "0" but less than a "1" value.

In the preferred embodiment, W/L for M402 or M302 is about half W/L for M301 or M401. Transistors M303–403, and M304–M404 have a W/L ratio about six times that of transistors M302–M402, while transistors M7–M12 and M1–M2 have W/L ratios respectively about ten time and fifteen times that of transistors M302–M402.

Of course, other fabrication processes may result in different relative ratios. Because fabrication of metal-on-semiconductor ("MOS") transistors having a desired threshold voltage $V_{th}$ is known, further details of implementing logic gates NOR1, NOR2 for FIG. 4 are not here presented. Those skilled in the art will realize that the relative trip points for M301–M401, and M302–M402 must take into account noise margins associated with signals on the bus segments and/or prcl, prcr, with Vdd, and with ground. Further, while fabricating M302–M402 with too small a W/L ratio can retard their turning on, this is relatively unimportant because larger sized devices M301–M401 will already have been turned on by prclprcr, turning off M7–M12.

It is apparent from FIG. 4, that once M12 turns on, it begins to pull busl down, and as soon as busl falls below the $V_{th}$ for M302, M7 is turned on, further helping pull busr down. It will be appreciated from the foregoing, that in addition to providing a "keeper" function, the cross-coupled NOR gate configuration of FIG. 4 also speeds up pull down of both bus segments.

Figure 5:
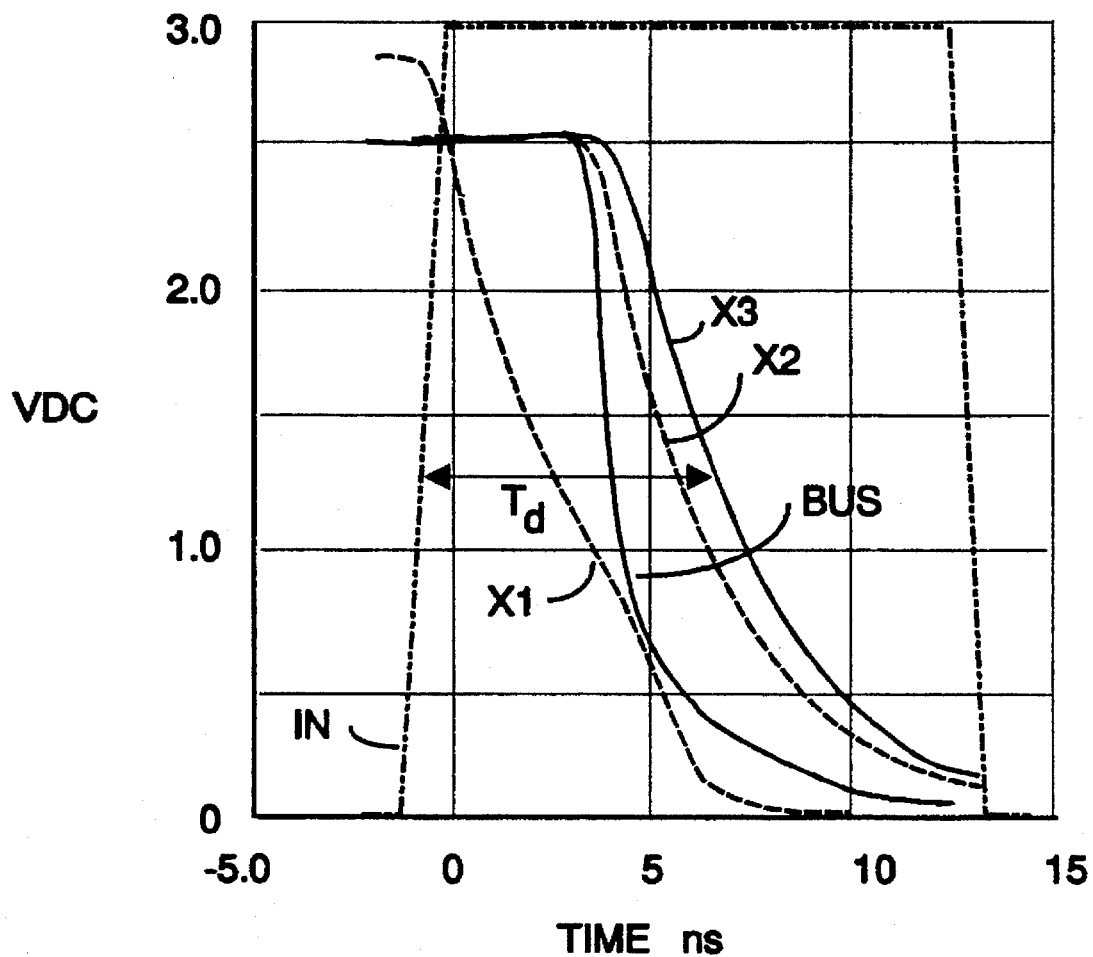
FIG. 5 is a computer simulation of waveforms associated with the present invention of FIG. 4, assuming a pulldown transistor W/L~24, and a 7.2 pF load.

FIG. 5 is a computer simulation showing waveforms within the circuit of FIG. 4, where a pulldown transistor (e.g., M101, M104) has a W/L~24, and where a 7.2 pF load is assumed. Note that this load is the same as that assumed in FIG. 1C, but that a much smaller pulldown transistor is now assumed.

Figure 1C:
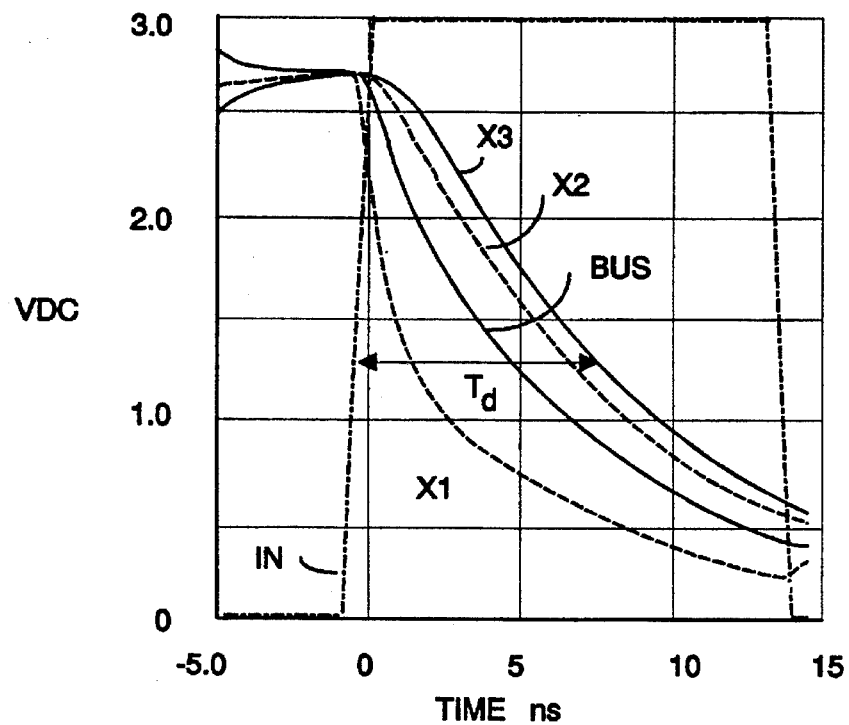
FIG. 1C is a computer simulation of waveforms associated with the prior art configuration of FIG. 1B, assuming a pulldown transistor W/L~80, and a 7.2 pF load.

Notwithstanding that the pulldown transistor has been downsized by about 66% (e.g., W/L~24 compared with W/L~80 for FIG. 1C), FIG. 5A shows a smaller delay $T_d$ between IN~1.3 VDC and X3~1.3 VDC than was shown in FIG. 1C, namely $T_d$~7.5 ns compared with about 8 ns. As noted, decreasing the capacitive load hastens circuit response. A computer simulation similar to FIG. 5 wherein a pulldown load transistor W/L~24, and a 6.2 pF load was assumed demonstrates about 6.9 ns between IN~1.3 VDC and X3~1.3 VDC, slightly faster than in FIG. 5 where a 7.2 pF load was assumed.

Thus, for a given magnitude of load capacitance, the circuit of FIG. 4 can pull busr, busl down more quickly than prior art configurations. Because the effective RC seen by M104 (and all other load pulldown transistors) is substantially reduced, the current sinking capacity of these devices may be reduced, which is to say that smaller devices having a smaller W/L ratio than is found in prior art load pulldown devices may be used.

The ability to downsize hundreds or thousands of pulldown transistors is very beneficial in that considerable area on the integrated circuit chip containing the present invention and bus segments is freed and made available for other circuitry. Further, because less discharge current is present, ground bounce and transients on the Vdd power supply are also reduced.

The ability to use smaller pulldown load transistors to pull down a segmented bus according to the present invention also reduces load capacitance seen by the bus, further benefiting bus operation. Finally, because the pulldown devices can sink less current while still pulling the bus down sufficiently rapidly, ground bounce and current surge problems will be reduced, according to the present invention. Alternatively, for a given magnitude of peak load current, the present invention will permit a bus to pulldown more rapidly than a conventional prior art bus system.

Modifications and variations may be made to the disclosed embodiments without departing from the subject and spirit of the invention as defined by the following claims.

What is claimed is:

1. In a system having a capacitively loaded bus coupled to be pulled up to a first logic level in response to a precharge signal during a precharge mode and to be pulled down to a second logic level by a load device, a method for reducing discharge current required to pull said bus down to said second logic level, the method comprising the steps of:

(a) dividing said bus into first and second bus segments that are electrically isolated from each other;

(b) coupling each said bus segment to be pulled up to said first logic level in said precharge mode; and (c) coupling each said bus segment by coupling devices each having a first input coupled to said precharge sijgnal a second input coupled to one of said bus segments and an output coupled to the other of second bus segment such that either may be pulled down to said second logic level by said load device, whereupon the remaining said bus segment is also pulled down to said second logic level;

wherein said step of dividing reduces equivalent load capacitance presented to each said bus segment and required to be discharged by said load device when pulling said bus segment down to said second logic level.

2. The method of claim 1, wherein step (a) creates less than three said bus segments.

3. The method of claim 1, wherein step (a) creates said bus segments having unequal lengths.

4. The method of claim 1, wherein step (c) coupling devices includes providing first and second NOR gates, each having a first input coupled to said precharge signal and a second input coupled to one of said bus segments, and each said NOR gate having an output coupled to pull down the other of said bus segments.

5. The method of claim 4, wherein step (c) includes coupling each said NOR gate output to a buffer pulldown device coupled between said second logic level and the other of said bus segments;

wherein each said buffer pulldown device prevents the bus segment to which it is coupled from simultaneously being pulled toward said first logic level and toward said second logic level.

6. The method of claim 4, wherein step (c) includes providing each said NOR gate with a higher trip point for said input relative to said first input.

7. The method of claim 1, wherein step (c) includes the step of preventing said bus segments from simultaneously being pulled toward said first logic level and toward said second logic level.

8. The method of claim 1, wherein said first logic level corresponds to a logic "1" level, and wherein said second logic level corresponds to a logic "0" level.

9. In a system having a bus that is segmented into first and second bus segments each coupled to at least one load device, a buffer coupled between and electrically insulating from each other said first and second bus segments, said buffer comprising:

first and second pull-up means, coupled respectively between a first logic level and said first and second bus segments, for pulling said respective bus segments to said first logic level in response to a precharge signal; and cross-coupled circuit means including coupling devices each having a first input. coupled to said precharge signal, a second input coupled to one of said bus segments and an output coupled to the other of said bus segments for coupling each said bus segment such that either may be pulled down to a second logic level by said load device, whereupon the remaining said bus segment is also pulled down to said second logic level;

wherein equivalent load capacitance presented to each said bus segment and required to be discharged by said load device when pulling said bus segment down to said second logic level is reduced.

10. The apparatus of claim 9, wherein said bus is segmented into less than three said bus segments.

11. The apparatus of claim 9, wherein said first and second bus segments have unequal lengths.

12. The apparatus of claim 9, wherein said cross-coupled circuit means includes first and second NOR gates, each having a first input coupled to said precharge signal and a second input coupled to one of said bus segments, and each said NOR gate having an output coupled to pull down the other of said bus segments.

13. The apparatus of claim 12, wherein said cross-coupled circuit means includes first and second buffer pulldown devices;

each said buffer pulldown device being cross-coupled between said bus segment and said second logic level, and responding to said output of said NOR gate whose said second input lead is coupled to the other of said bus segments;

wherein each said buffer pulldown device prevents the bus segment to which it is coupled from simultaneously being pulled toward said first logic level and toward said second logic level.

14. The apparatus of claim 12, wherein each said NOR gate includes first and second parallel-coupled devices having input leads coupled respectively to said precharge signal and to a said bus segment;

wherein said second parallel-coupled device has a higher trip point than said first parallel-coupled device.

15. The apparatus of claim 14, wherein said first and second parallel-coupled devices are metal-on-silicon transistors, and wherein said second parallel-coupled device has a smaller conduction channel width to length ratio relative to said first parallel-coupled device.

16. The apparatus of claim 9, wherein said first logic level corresponds to a logic "1" level, and wherein said second logic level corresponds to a logic "0" level.

* * * * *